(12) United States Patent
Kalutarage et al.

(10) Patent No.: US 11,515,149 B2
(45) Date of Patent: Nov. 29, 2022

(54) DEPOSITION OF FLOWABLE SILICON-CONTAINING FILMS

(71) Applicant: Applied Materials, Inc., Santa Clara, CA (US)

(72) Inventors: Lakmal C. Kalutarage, San Jose, CA (US); Mark Saly, Santa Clara, CA (US); David Thompson, San Jose, CA (US); Abhijit Basu Mallick, Palo Alto, CA (US); Tejasvi Ashok, Fremont, CA (US); Pramit Manna, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 247 days.

(21) Appl. No.: 15/654,185

(22) Filed: Jul. 19, 2017

(65) Prior Publication Data
US 2018/0025907 A1     Jan. 25, 2018

Related U.S. Application Data

(60) Provisional application No. 62/364,273, filed on Jul. 19, 2016.

(51) Int. Cl.
*C23C 16/22*   (2006.01)
*H01L 21/02*   (2006.01)
*H01L 21/762*  (2006.01)

(52) U.S. Cl.
CPC .... *H01L 21/02274* (2013.01); *H01L 21/0217* (2013.01); *H01L 21/0234* (2013.01); *H01L 21/02126* (2013.01); *H01L 21/02164* (2013.01); *H01L 21/02167* (2013.01); *H01L 21/02208* (2013.01); *H01L 21/02211* (2013.01); *H01L 21/02323* (2013.01); *H01L 21/02337* (2013.01); *H01L 21/76224* (2013.01)

(58) Field of Classification Search
None
See application file for complete search history.

(56) References Cited

U.S. PATENT DOCUMENTS

| | | | |
|---|---|---|---|
| 7,087,271 B2 | 8/2006 | Rhee et al. | |
| 7,390,537 B1 * | 6/2008 | Wu | C23C 16/401 427/577 |
| 7,563,715 B2 | 7/2009 | Haukka et al. | |
| 7,892,964 B2 | 2/2011 | Srinivasan et al. | |
| 8,455,049 B2 | 6/2013 | Cameron et al. | |

(Continued)

FOREIGN PATENT DOCUMENTS

CN         1522462 A      8/2004

OTHER PUBLICATIONS

Heo et al. Structure and Property Analysis of Nanoporous Low Dielectric Constant SiCOH Thin Film, Journal or the Korean Institute of Surface Engineering, pp. 167-169 (May 2009).*

(Continued)

*Primary Examiner* — David P Turocy
(74) *Attorney, Agent, or Firm* — Servilla Whitney LLC

(57) ABSTRACT

Methods for seam-less gapfill comprising forming a flowable film by exposing a substrate surface to a silicon-containing precursor and a co-reactant are described. The silicon-containing precursor has at least one akenyl or alkynyl group. The flowable film can be cured by any suitable curing process to form a seam-less gapfill.

20 Claims, 2 Drawing Sheets

(56) References Cited

U.S. PATENT DOCUMENTS

| | | | |
|---|---|---|---|
| 8,557,694 B2 | 10/2013 | Cha | |
| 8,557,712 B1* | 10/2013 | Antonelli | C23C 16/045 |
| | | | 257/E21.26 |
| 9,455,138 B1* | 9/2016 | Fukazawa | H01L 21/0228 |
| 9,534,285 B2 | 1/2017 | Xu et al. | |
| 2002/0173172 A1* | 11/2002 | Loboda | H01L 21/3122 |
| | | | 438/786 |
| 2004/0152334 A1* | 8/2004 | Ohto | C23C 16/30 |
| | | | 438/758 |
| 2008/0152334 A1* | 6/2008 | Choi | G03B 13/32 |
| | | | 396/97 |
| 2011/0165780 A1 | 7/2011 | Kanjolia et al. | |
| 2013/0217239 A1* | 8/2013 | Mallick | H01L 21/02123 |
| | | | 438/778 |
| 2013/0217240 A1* | 8/2013 | Mallick | H01L 21/02167 |
| | | | 438/778 |
| 2013/0244446 A1* | 9/2013 | Tsuji | H01L 21/0228 |
| | | | 438/778 |
| 2014/0051264 A1* | 2/2014 | Mallick | H01L 21/02164 |
| | | | 438/786 |
| 2014/0302688 A1* | 10/2014 | Underwood | H01L 21/02216 |
| | | | 438/786 |
| 2015/0004806 A1 | 1/2015 | Ndiege et al. | |
| 2015/0118862 A1* | 4/2015 | Reilly | C23C 16/401 |
| | | | 438/778 |
| 2016/0017492 A1 | 1/2016 | Xie et al. | |
| 2016/0056071 A1* | 2/2016 | Draeger | H01L 23/53238 |
| | | | 438/653 |
| 2016/0122869 A1* | 5/2016 | Lei | C23C 16/36 |
| | | | 427/579 |
| 2018/0201736 A1* | 7/2018 | Kawato | C09D 183/16 |

OTHER PUBLICATIONS

PCT International Search Report and Written Opinion in PCT/US2017/042811 dated Oct. 25, 2017, 10 pages.

Gerault, et al., "X-Ray Photoelectron Spectroscopy and Raman Spectroscopy Investigations of Amorphous $Si_xC_{1-x}(H)$ Coatings Obtained by Chemical Vapour Deposition from Thermally Labile Organosilicon Compounds", Thin Solid Films, vol. 101, No. 1, pp. 83-96 (1983).

Heo, et al., "Structure and Property Analysis of Nanoporous Low Dielectric Constant SiCOH Thin Films", Journal of the Korean Institute of Surface Engineering, pp. 167-169 (May 27, 2009).

PCT International Preliminary Report on Patentability in PCT/US2017/042811 dated Jan. 31, 2019, 7 pages.

Heo, Kyuyoung, et al., "Quantitative Structure and Property Analysis of Nanoporous Low Dielectric Constant SiCOH Thin Films", J. Phys. Chem. C 2007, 111, 10848-10854, May 16, 2007.

* cited by examiner

DEPOSITION OF FLOWABLE SILICON-CONTAINING FILMS

CROSS-REFERENCE TO RELATED APPLICATIONS

This application claims priority to U.S. Provisional Application No. 62/364,273, filed Jul. 19, 2016, the entire disclosure of which is hereby incorporated by reference herein.

TECHNICAL FIELD

The present disclosure relates generally to methods of depositing thin films. In particular, the disclosure relates to processes for filling narrow trenches with flowable silicon-containing films.

BACKGROUND

In microelectronics device fabrication there is a need to fill narrow trenches having aspect ratios (AR) greater than 10:1 with no voiding for many applications. One application is for shallow trench isolation (STI). For this application, the film needs to be of high quality throughout the trench (having, for example, a wet etch rate ratio less than two) with very low leakage. As the dimensions of the structures decrease and the aspect ratios increase post curing methods of the as deposited flowable films become difficult. Resulting in films with varying composition throughout the filled trench.

Conventional plasma-enhanced chemical vapor deposition (PECVD) of dielectric films form a "mushroom shape" film on top of the narrow trenches. This is due to the inability of the plasma to penetrate into the deep trenches. The results in pinching-off the narrow trench from the top; forming a void at the bottom of the trench.

Additionally, silicon-containing films, such as SiCO, SiCON, SiCN, are widely used in the manufacture of semiconductor devices. For example, these carbon-containing gap-fill films can be used for patterning applications. Due to the presence of high carbon levels, these films typically show high etch selectivity compared to oxide and nitride films. The etch selectivity can be important for gap-fill films to be used in patterning applications. Therefore, there is a need for precursors and methods for depositing silicon-containing films.

SUMMARY

One or more embodiments of the disclosure are directed to processing methods comprising exposing a substrate surface to a silicon-containing precursor and a co-reactant to deposit a flowable film. The silicon-containing precursor has at least one akenyl or alkynyl group.

Additional embodiments of the disclosure are directed to processing methods comprising providing a substrate surface having at least one feature thereon. The at least one feature extends a depth from the substrate surface to a bottom surface and has a width defined by a first sidewall and a second sidewall. The substrate surface is exposed to a silicon-containing precursor and co-reactant to form a flowable film on the substrate surface and the first sidewall, second sidewall and bottom surface of the at least one feature. The flowable film fills the feature with substantially no seam formed. The silicon containing precursor comprises a compound having any of Structures I-V

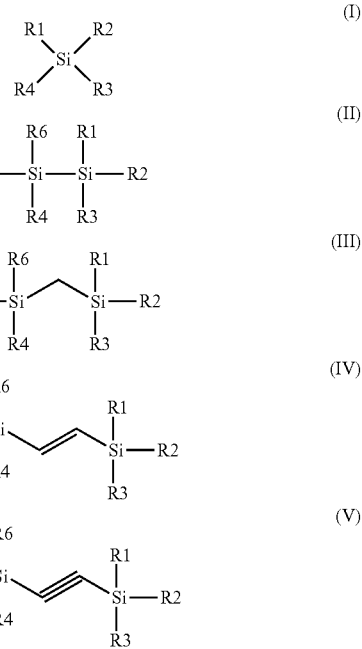

where each of R1-R6 is independently selected from the group consisting of CR'CR''$_2$, CCR', H, methyl, ethyl, propyl, isopropyl, n-butyl, sec-butyl, isobutyl, tert-butyl, NR'$_2$ and OR', where R' and R'' are independently selected from the group consisting of H, methyl, ethyl, propyl, isopropyl, n-butyl, sec-butyl, isobutyl and tert-butyl, at least one of R1-R6 is selected from the group consisting of CR'CR''$_2$ or CCR'. The co-reactant comprises an ammonia plasma. The flowable film is cured to solidify the film and form a substantially seam-free gapfill.

Further embodiments of the disclosure are directed to processing methods comprising providing a substrate surface having at least one feature thereon. The at least one feature extends a depth from the substrate surface to a bottom surface and has a width defined by a first sidewall and a second sidewall. The substrate surface is exposed to a silicon-containing precursor and co-reactant to form a flowable film on the substrate surface and the first sidewall, second sidewall and bottom surface of the at least one feature. The flowable film fills the feature with substantially no seam formed. The silicon containing precursor comprises one or more of tetravinylsilane (Si(CHCH$_2$)$_4$) or silicon tetraacetalide (Si(CCH)$_4$), and the co-reactant comprises an ammonia plasma. The flowable film is cured to solidify the film and form a substantially seam-free gapfill.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
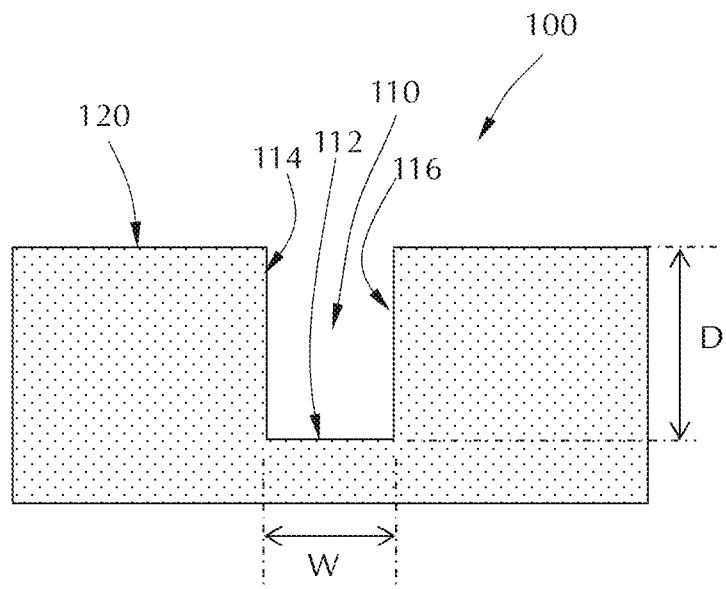
FIG. 1 shows a cross-sectional view of a substrate feature in accordance with one or more embodiment of the disclosure.

Before describing several exemplary embodiments of the invention, it is to be understood that the invention is not limited to the details of construction or process steps set forth in the following description. The invention is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Embodiments of the disclosure provide methods of depositing a gap-fill film (e.g., SiC, SiCO, SiCN, SiCON) in high aspect ratio (AR) structures with small dimensions. Some embodiments advantageously provide methods involving cyclic deposition-treatment processes that can be performed in a cluster tool environment. Some embodiments advantageously provide seam-free high quality silicon-containing films to fill up high AR trenches with small dimensions. Some embodiments advantageously provide films containing high carbon content. In one or more embodiments, the high carbon content films can be advantageously used in hard mask and low-k flowable applications.

One or more embodiments of the disclosure are directed to processes where flowable silicon-containing films are deposited which are able to fill high aspect ratio structures (e.g., AR>8:1). Embodiments of the disclosure provide new precursors to generate SiC, SiOC, SiCN, SiOCN, SiO and SiN flowable films using F-CVD (flowable chemical vapor deposition) for gapfill applications. The precursors of various embodiments include alkenyl (vinyl) and/or alkynyl groups. In one or more embodiments, the precursors are exposed to reactive radicals to initiate a radical induced polymerization in the deposition chamber.

Flowable films, as deposited, are generally not stable and age upon exposure to atmospheric conditions. The flowable films of some embodiments are deposited by a silicon-containing precursor and radical forms of, for example, $NH_3/O_2$ as co-reactants. These films are then cured by ozone/UV/steam annealing/$NH_3$ annealing, etc., which results in a cured film.

For descriptive purposes, the deposition of flowable CVD films for gapfill applications is described. However, those skilled in the art will understand that the precursors and methods described are not limited to gapfill applications and can be used for any silicon-containing films. FIG. 1 shows a partial cross-sectional view of a substrate 100 with a feature 110. The Figures show substrates having a single feature for illustrative purposes; however, those skilled in the art will understand that there can be more than one feature. The shape of the feature 110 can be any suitable shape including, but not limited to, trenches and cylindrical vias. As used in this regard, the term "feature" means any intentional surface irregularity. Suitable examples of features include, but are not limited to trenches which have a top, two sidewalls and a bottom, peaks which have a top and two sidewalls. Features can have any suitable aspect ratio (ratio of the depth of the feature to the width of the feature). In some embodiments, the aspect ratio is greater than or equal to about 5:1, 10:1, 15:1, 20:1, 25:1, 30:1, 35:1 or 40:1.

The substrate 100 has a substrate surface 120. The at least one feature 110 forms an opening in the substrate surface 120. The feature 110 extends from the substrate surface 120 to a depth D to a bottom surface 112. The feature 110 has a first sidewall 114 and a second sidewall 116 that define a width W of the feature 110. The open area formed by the sidewalls and bottom are also referred to as a gap.

One or more embodiments of the disclosure are directed to processing methods in which a substrate surface with at least one feature thereon is provided. As used in this regard, the term "provided" means that the substrate is placed into a position or environment for further processing.

Figure 2:
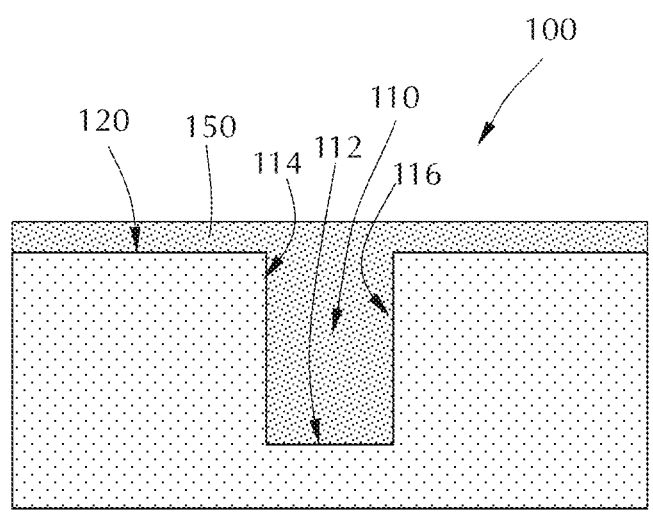
FIG. 2 shows a cross-sectional view of the substrate feature of FIG. 1 with a flowable film thereon.

As shown in FIG. 2, a flowable film 150 is formed on the substrate surface 120 and the first sidewall 114, second sidewall 116 and bottom surface 112 of the at least one feature 110. The flowable film 150 fills the at least one feature 110 so that substantially no seam is formed. A seam is a gap that forms in the feature between, but not necessarily in the middle of, the sidewalls of the feature 110. As used in this regard, the term "substantially no seam" means that any gap formed in the film between the sidewalls is less than about 1% of the cross-sectional area of the sidewall.

The flowable film 150 can be formed by any suitable process. In some embodiments, the forming the flowable film is done by plasma-enhanced chemical vapor deposition (PECVD). Stated differently, the flowable film can be deposited by a plasma-enhanced chemical vapor deposition process.

Embodiments of the disclosure advantageously provide a class of silicon-containing precursors for use in deposition of flowable CVD films. Some embodiments advantageously provide methods of gapfilling without formation of a seam. Some embodiments advantageously provide methods for curing a flowable CVD film in which a trench or surface feature is filled in a seamless manner.

Embodiments of the disclosure are directed to processing methods comprising exposing a substrate surface to a silicon-containing precursor and a co-reactant to deposit a flowable film. The silicon-containing precursor has at least one akenyl or alkynyl group to allow participation in a radical polymerization reaction. Structures I-V provide examples of silicon-containing precursors for use with various embodiments of the disclosure.

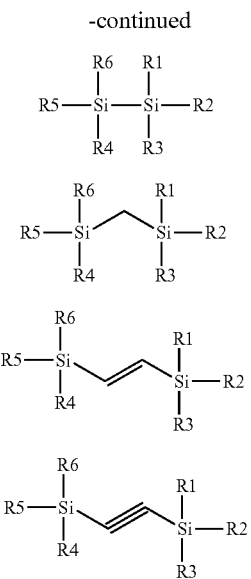

The R groups (R1-R6) of formula (I) are each independently selected from the group consisting of CR'CR"$_2$, CCR', H, methyl, ethyl, propyl, isopropyl, n-butyl, sec-butyl, isobutyl, tert-butyl, NR'$_2$ and OR'. The R' and R" groups are independently selected from the group consisting of H, methyl, ethyl, propyl, isopropyl, n-butyl, sec-butyl, isobutyl and tert-butyl. At least one of R1-R6 (R1-R4 for Formula I) is selected from the group consisting of CR'CR"$_2$ or CCR'. Those skilled in the art will understand that the use of the term "R groups" refers to any of R1 through R6 (R1-R4 for Formula I). In some embodiments, at least one of the R groups is not a hydrogen. In some embodiments, at least one of the R groups is a methyl group. In some embodiments, at least one of the R groups is an ethyl group. In some embodiments, at least one R group is a vinyl group. In some embodiments, each of the R groups is the same group.

In one or more embodiments, the silicon precursor comprises an alkenyl group so that one or more of the R groups of the silicon-containing precursor comprises CR'CR"$_2$. In some embodiments, all of the R groups of the silicon-containing precursor comprises CR'CR"$_2$. In one or more embodiments, substantially all of the R groups of the silicon precursor comprises CR'CR"$_2$. As used in this regard, "substantially all" means that greater than or equal to about 95% of the R groups are the specified group. In some embodiments, each R' is the same substituent and each R" is the same substituent. In one or more embodiments, the silicon-containing precursor comprises tetravinylsilane (Si(CHCH$_2$)$_4$).

In one or more embodiments, the silicon-containing precursor comprises an alkynyl group so that one or more of the R groups of the silicon-containing precursor comprises CCR'. In some embodiments, all of R groups of the silicon-containing precursor comprises CCR'. In one or more embodiments, substantially all of the R groups of the silicon precursor comprises CCR'. As used in this regard, "substantially all" means that greater than or equal to about 95% of the R groups are the specified group. In some embodiments, each R' is the same substituent and each R" is the same substituent. In one or more embodiments, the silicon-containing precursor comprises silicon tetraacetalide (Si(CCH)$_4$).

A Si-containing precursor with any of Structures I-V may be vaporized to a CVD chamber, and a suitable co-reactant (e.g., NH$_3$/O$_2$/CO$_2$/CO/Ar/He/H$_2$, or combination thereof) can be delivered to the chamber through, for example, a RPS (remote plasma source) which will generate plasma active species as the co-reactants. Plasma activated co-reactant molecules (radicals) have high energies and may react with Si-containing precursor molecules in the gas phase to form corresponding flowable polymers. In some embodiments, the plasma is generated with a plasma gas that comprises one or more of NH$_3$, O$_2$, CO$_2$, CO, Ar, He or H$_2$. In some embodiments, the plasma gas comprises ammonia, or consists essentially of ammonia. As used in this regard, the term "consists essentially of" means that greater than or equal to about 90 molecular % of the reactive species in the plasma are ammonia.

The plasma can be generated or ignited within the processing chamber (e.g., a direct plasma) or can be generated outside of the processing chamber and flowed into the processing chamber (e.g., a remote plasma).

The flowable film 150 can be formed at any suitable temperature. In some embodiments, the flowable film 150 is formed at a temperature in the range of about −20° C. to about 100° C. The temperature can be kept low to preserve the thermal budget of the device being formed. In some embodiments, forming the flowable film occurs at a temperature less than about 300° C., 250° C., 200° C., 150° C., 100° C., 75° C., 50° C., 25 ° C. or 0° C.

Films with high carbon content may have many applications, for example, in the patterning of hard masks and for flowable low K films. In some embodiments, the flowable film using precursors of any of Structures I-V can deposit films which high carbon content. In some embodiments, the film has a carbon content up to about 85 atomic %. In one or more embodiments, the flowable film has a carbon content greater than about 40, 45, 50, 55, 60, 65, 70, 75 or 80 atomic %, and less than about 95, 90 or 85 atomic %. In some embodiments, the flowable film has a carbon content in the range of about 40 to about 85 atomic %, or in the range of about 50 to about 85 atomic %, or in the range of about 60 to about 80 atomic %.

The composition of the flowable film can be adjusted by changing the composition of the reactive gas. In some embodiments, the flowable film comprises one or more of SiC, SiCO, SiCN, SiCON, SiO and SiN. To form an oxygen containing film, the co-reactant may comprise, for example, one or more of oxygen, ozone or water. To form a nitrogen containing film, the co-reactant may comprise, for example, one or more of ammonia, hydrazine, NO$_2$ or N$_2$. To form a carbon containing film, the reactive gas may comprise, for example, one or more of propylene and acetylene. Those skilled in the art will understand that combinations of or other species can be included in the reactive gas mixture to change the composition of the flowable film.

The flowable film may deposit on the wafer (temperature of the wafer can be from −10° C. to 200° C.) and due to their flowability, polymers will flow through trenches and make a gap-fill. Then these films are subjected curing steps such as ozone/UV/steam annealing/NH$_3$ annealing to get stable films. In some embodiments, the method provides one or more of SiC, SiCO, SiCN, SiCON, SiO, and/or SiN flowable films. Accordingly, after formation of the flowable film 150, the film may be cured to solidify the flowable film and form a substantially seam-free gapfill. In one or more embodiments, curing the flowable film comprises exposing the flowable film to one or more of ozone, UV light, steam annealing, ammonia annealing and oxygen plasma. In some embodiments, the flowable film is cured by exposing the film to a UV curing process. The UV curing process can occur at a temperature in the range of about 10° C. to about 550° C. The UV curing process can occur for any suitable time frame necessary to sufficiently solidify the flowable film. The UV cure can be performed with different parameters, e.g., power, temperature, environment. In some embodiments, the UV cure occurs in an acetylene/ethylene environment.

In some embodiments, curing the flowable film comprises thermal annealing. Thermal annealing can occur at any suitable temperature and any suitable environment. In some embodiments, the flowable film is cured by thermal annealing in an acetylene/ethylene environment.

In some embodiments, curing the flowable film comprises exposure to a plasma or an electron beam. A plasma exposure to cure the film comprises a plasma separate from the PECVD plasma. The plasma species and processing chamber can be the same and the plasma cure is a different step than the PECVD process.

In some embodiments, curing the flowable film comprises exposing the flowable film to a steam anneal and/or oxygen plasma. The use of a steam anneal and/or oxygen plasma may reduce the carbon content of the flowable film so that the cured film has a lower carbon content than the as-deposited flowable film. The use of steam anneal and/or oxygen plasma may convert the deposited flowable SiC, SiCN, or SiCO film to SiO. The carbon content of such films has been substantially removed; meaning that there is less than about 5% of the carbon present in the film pre-curing.

In some embodiments, the precursor of any of Structures I-V can be used with another precursor (co-flow with another Si-containing precursor) in a flowable process to deposit films of various compositions. As an example, precursors of Structures I-V can be used with trisilylamine (TSA)/NH$_3$ process to incorporate carbon in the film. The flowable films obtained from TSA/NH$_3$ process are either SiO or SiN films. By the addition of the silicon-containing precursor of Structures I-V, SiCO, SICON or SiCN films can be deposited. In another example, a silicon-containing precursor can be used with an octamethylcyclotetrasiloxane (OMCTS)/O$_2$ process. OMCTS/O$_2$ process gives SiOC films and precursors of Structures I-V can be used to increase C % in the film. SiC, SiOC, SiCN, SiOCN, SiO, and SiN flowable films can be obtained by this method. In a further example, TSA/silanes(Si$_x$H$_y$)/OMCTS can mixed or co-flowed with a precursor of Structures I-V to deposit a SiCO, SiCON or SiN film.

In some embodiments, the silicon precursor of Structures I-V is added into another process to dope carbon into a silicon film. For example, a silicon deposition process may have some of precursors from formula I-V dosed into the process to incorporate carbon atoms into the film. Some embodiments of the disclosure are directed to methods of doping carbon into a film by co-flowing a carbon containing silane with a silylamine to form a flowable film. In one or more embodiments, tetravinylsilane is coflowed with trisilylamine and an ammonia plasma to form a film with a carbon content greater than or equal to about 50%, 60%, 70%, 75% or 80%, on an atomic basis.

In some embodiments, the flowable film is doped with another element. For example, some flowable films may be doped with one or more of B, As or P. The flowable films can be doped with elements such as boron (B) and phosphorous (P) to improve film properties. Precursors containing boron and phosphorous can be either co-flown with Si-containing precursors during the deposition process or can be infiltrated after the deposition is done. Boron containing precursors can be aminoboranes/boranes compounds and phosphorous containing precursors can be phosphate/phosphite compounds. In some embodiments, doping the flowable film comprises co-flowing a dopant precursor with the silicon-containing precursor. In some embodiments, doping the flowable film comprises implantation of the dopant element in a separate process.

Some embodiments of the disclosure are directed to methods of obtaining SiC, SiCO, SiCON, SiCN, SiN, SiO flowable films from silane and hydrocarbons. Suitable hydrocarbons include, but are not limited to those showed as Structures VI-XV.

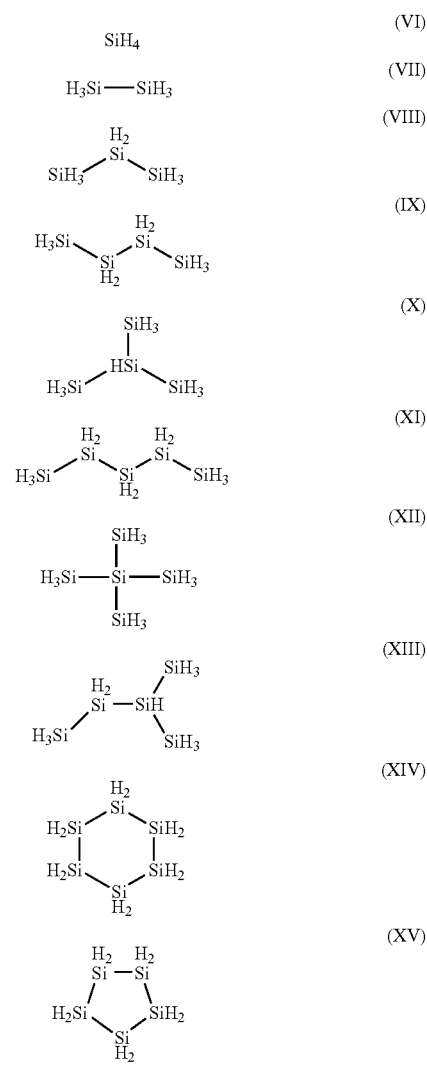

In some embodiments, the silane precursor comprises a compound with no carbon atoms. Those skilled in the art will understand that the compounds listed as Structures VI-XV are merely representative of some possible silane precursors. The structures illustrated can be modified to include silane substituents or other atoms.

At least one precursor of Structures I-V and at least one precursor from any hydrocarbon (C$_x$H$_y$) can be used in any combination. The silane precursor(s) of Structures I-V and hydrocarbon (C$_x$H$_y$) can be vaporized to a CVD chamber, and co-reactants (e.g., $NH_3/O_2/CO_2/CO/Ar/He/H_2$, or combinations thereof) can be are delivered to the chamber through RPS (remote plasma source) which will generate plasma active species as the co-reactants. Plasma activated co-reactant molecules (radicals) have high energies and react with Si-containing precursor molecules in the gas phase to form corresponding flowable polymers. These polymers will deposit on the wafer (temperature of the wafer can be from −10 C to 300 C.) and due to their flowability, polymers will flow through trenches and make a gap-fill. Then these films are subjected curing steps such as ozone/UV/steam annealing/NH3 annealing to get stable SiC, SiCO, SiCON, SiCN, SiN, SiO films Example 1

Figure 3:
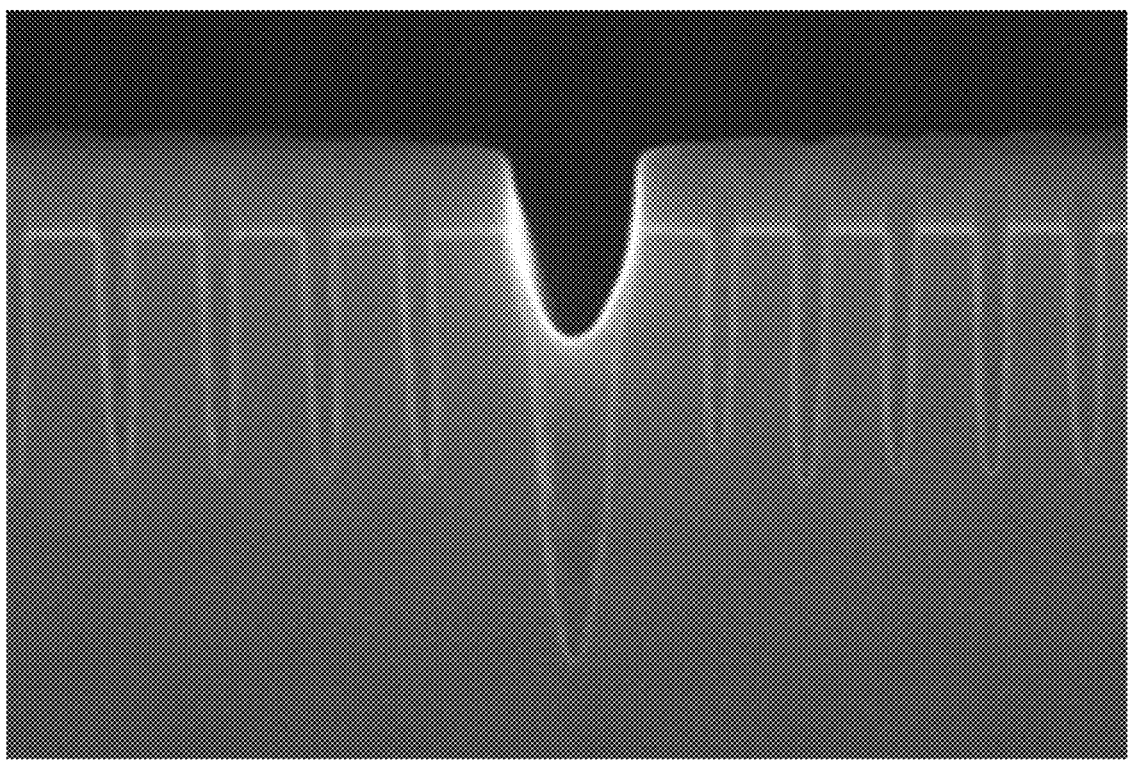
FIG. 3 shows an SEM image of a film deposited in accordance with one or more embodiment of the disclosure.

Deposition of Flowable SiCON Film From Tetravinylsilane ($Si(CHCH_2)_4$, Referred to as TVS) and $NH_3$ Plasma Flowable films were obtained by CVD deposition of tetravinylsilane (TVS) and a remote $NH_3$ plasma at temperatures in the range of about 80° C., 100° C. and 130° C., with a pressure less than about 1 torr. The as-deposited film had a refractive index of 1.58 and a wet etch rate of 1.8 A/min in 100:1 diluted HF. An SEM image of the flowable film is shown in FIG. 3.

Example 2

Deposition of Flowable SiCON Film From Silicontetraacetalide ($Si(CCH)_4$ and $NH_3$ Plasma Flowable films were obtained from silicontetraacetalide and a remote $NH_3$ plasma at temperatures in the range of about 0° C. to about 80° C., 100° C. and 130° C., with pressures less than about 1 torr. The as-deposited film had a refractive index of about 1.58.

Example 3

Increase C % in $TSA/NH_3$ Process by Co-flowing TVS with TSA

Flowable films were obtained by co-flowing TVS/TVA and $NH_3$ plasma at 0° C. The flowable films obtained from $TSA/NH_3$ had almost no carbon in the film while the flowable film obtained by co-flowing TVS and TSA had a carbon content up to 80%.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A processing method comprising:
exposing a substrate surface to a silicon-containing precursor and a co-reactant to deposit a flowable film at a temperature in a range of about −20° C. to about 100° C., the silicon-containing precursor comprises a compound having Structure IV or V

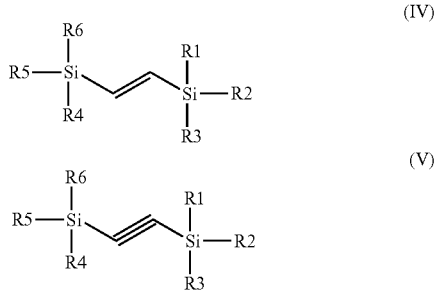

where each of R1-R6 is independently selected from the group consisting of CR'CR"$_2$, CCR', H, methyl, ethyl, propyl, isopropyl, n-butyl, sec-butyl, isobutyl, tert-butyl, NR'$_2$ and OR', where R' and R" are independently selected from the group consisting of H, methyl, ethyl, propyl, isopropyl, n-butyl, sec-butyl, isobutyl and tert-butyl, and the flowable film having a carbon content in a range of about 55 to about 95 atomic percent; and
curing the flowable film to form a cured film.

2. The processing method of claim 1, wherein the co-reactant comprises a plasma comprising a plasma gas.

3. The processing method of claim 2, wherein the plasma gas comprises one or more of NH$_3$, O$_2$, CO$_2$, CO, Ar, He or H$_2$.

4. The processing method of claim 3, wherein the plasma gas comprises ammonia.

5. The processing method of claim 2, further comprising doping the flowable film with one or more of B, As or P.

6. The processing method of claim 1, wherein at least one of R1-R6 is selected from the group consisting of CR'CR"$_2$ or CCR'.

7. The processing method of claim 6, wherein one or more of R1-R6 of the silicon-containing precursor is CR'CR"$_2$.

8. The processing method of claim 7, wherein all of R1-R6 of the silicon-containing precursor comprises CR'CR"$_2$.

9. The processing method of claim 8, wherein each R' is the same and each R" is the same substituent.

10. The processing method of claim 6, wherein one or more of R1-R6 of the silicon-containing precursor is CCR'.

11. The processing method of claim 10, wherein all of R1-R6 of the silicon-containing precursor comprises CCR'.

12. The processing method of claim 11, wherein each R' is the same and each R" is the same substituent.

13. The processing method of claim 1, wherein curing the flowable film comprises exposing the flowable film to one or more of ozone, UV light, steam annealing, ammonia annealing and oxygen plasma.

14. The processing method of claim 13, wherein the cured film comprises one or more of SiC, SiOC, SiCN, SiOCN, SiO or SiN.

15. The processing method of claim 1, wherein the silicon-containing precursor is co-flowed with a silane precursor.

16. The method of claim 1, wherein the carbon content is in a range of about 60 to about 80 atomic percent.

17. A processing method comprising:
exposing a substrate surface having at least one feature thereon to a silicon-containing precursor and co-reactant to form a flowable film on the substrate surface and a first sidewall, second sidewall and bottom surface of the at least one feature, the at least one feature extending a depth from the substrate surface to the bottom surface, the at least one feature having a width defined by the first sidewall and the second sidewall, the flowable film filling the feature with substantially no seam formed, the silicon containing precursor comprising a compound having any of Structures IV-V

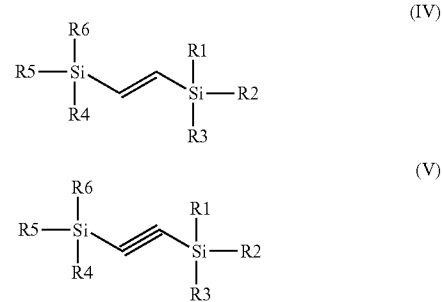

where each of R1-R6 is independently selected from the group consisting of CR'CR"$_2$, CCR', H, methyl, ethyl, propyl, isopropyl, n-butyl, sec-butyl, isobutyl, tert-butyl, NR'$_2$ and OR', where R' and R" are independently selected from the group consisting of H, methyl, ethyl, propyl, isopropyl, n-butyl, sec-butyl, isobutyl and tert-butyl, at least one of R1-R6 is selected from the group consisting of CR'CR"$_2$ or CCR', and the co-reactant comprises an ammonia plasma; and curing the flowable film to solidify the film and form a substantially seam-free gapfill having a carbon content greater than or equal to about 55 atomic percent.

18. The method of claim 17, wherein the carbon content is in a range of about 60 to about 80 atomic percent.

19. A processing method comprising:

exposing a substrate surface having at least one feature thereon to a silicon-containing precursor and co-reactant to form a flowable film at a temperature in a range of about −20° C. to about 100° C., the at least one feature extending a depth from the substrate surface to a bottom surface, the at least one feature having a width defined by a first sidewall and a second sidewall, the flowable film formed on the substrate surface and the first sidewall, second sidewall and bottom surface of the at least one feature, the flowable film filling the feature with substantially no seam formed, the silicon containing precursor comprising a compound having any of Structures IV-V

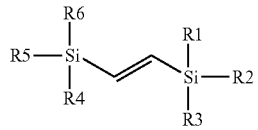

(IV)

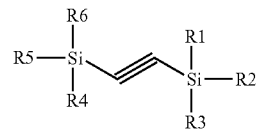

(V)

where each of R1-R6 is independently selected from the group consisting of CR'CR"$_2$, CCR', H, methyl, ethyl, propyl, isopropyl, n-butyl, sec-butyl, isobutyl, tert-butyl, NR'$_2$ and OR', where R' and R" are independently selected from the group consisting of H, methyl, ethyl, propyl, isopropyl, n-butyl, sec-butyl, isobutyl and tert-butyl, at least one of R1-R6 is CCR', and the co-reactant comprises an ammonia plasma; and curing the flowable film to solidify the film and form a substantially seam-free gapfill having a carbon content greater than or equal to about 55 atomic percent.

20. The method of claim 19, wherein the carbon content is in a range of about 60 to about 80 atomic percent.

* * * * *